United States Patent [19]

Glomb et al.

[11] Patent Number: 4,826,453
[45] Date of Patent: May 2, 1989

[54] BACKPLANE WIRING FOR ELECTRICAL ASSEMBLIES

[75] Inventors: Kurt Glomb, Germering; Heinz Niggl, Poecking; Leo Pelzl, Holzkirchen; Karl Zell, Niederpoecking, all of Fed. Rep. of Germany

[73] Assignee: Siemens Aktiengesellschaft, Berlin and Munich, Fed. Rep. of Germany

[21] Appl. No.: 36,292

[22] Filed: Apr. 9, 1987

Related U.S. Application Data

[63] Continuation of Ser. No. 783,114, Oct. 2, 1985, abandoned.

[30] Foreign Application Priority Data

Oct. 31, 1984 [DE] Fed. Rep. of Germany ....... 3439886

[51] Int. Cl.$^4$ .............................................. H01R 13/40
[52] U.S. Cl. ..................................... 439/595; 439/744
[58] Field of Search ...................... 439/586–603, 439/733, 739, 743, 744, 747, 751, 869, 871, 873

[56] References Cited

U.S. PATENT DOCUMENTS

| 3,139,492 | 6/1964 | Cage, Jr. ......................... 339/186 M |
| 3,673,548 | 6/1978 | Mattingly et al. .............. 339/221 M |
| 4,035,047 | 7/1977 | Ammon ........................... 339/221 M |
| 4,056,300 | 11/1977 | Schamacher .................... 339/184 M |
| 4,472,012 | 9/1984 | Michaels ............................. 439/597 |
| 4,544,220 | 10/1985 | Aiello et al. ......................... 439/600 |
| 4,565,416 | 1/1986 | Rudy et al. .......................... 439/600 |
| 4,657,320 | 4/1987 | Bamford et al. ...................... 439/65 |

FOREIGN PATENT DOCUMENTS 7422768.2 11/1974 Fed. Rep. of Germany .
1029090 5/1966 United Kingdom ........... 339/184 M Primary Examiner—David Pirlot
Attorney, Agent, or Firm—Hill, Van Santen, Steadman & Simpson

[57] ABSTRACT

The retention of a contact blade of a backplane printed circuit board in a centering strip ensues by means of a resilient web in the floor of the centering strip engagable by a calotte-like pock on the contact blade, thus providing definable retaining forces.

4 Claims, 2 Drawing Sheets

BACKPLANE WIRING FOR ELECTRICAL ASSEMBLIES

This application is a continuation of Ser. No. 783,114 filed Oct. 2, 1985 now abandoned.

BACKGROUND OF THE INVENTION

1. Field of the Invention

The invention relates to a backplane wiring for electrical assemblies composed of a backplane printed circuit board with inserted contact blades and centering strips pluggable thereto.

2. Description of the Prior Art

Centering strips which are each fashioned as a rectangular housing open at one side and serve for the acceptance of spring clips which are rigidly connected to electrical assemblies, the centering strips including openings in the floor for the passage of the contact blades of a printed circuit board must meet a number of demands. They should be easily pluggable but should hold well in their plugged condition. When too great a pressure must be exerted when plugging to the centering strips, the contact blades may be pressed out of the backplane printed circuit board since these blades have only a limited holding force. Further, the replacement of individual contact blades should be possible without damaging the centering strips. These demands are not met by the prior art.

SUMMARY OF THE INVENTION

It is therefore an object of the present invention to provide a backplane wiring comprising a backplane printed circuit board and centering strips wherein the centering strips can be plugged without exerting great forces and hold well on the backplane printed circuit board in their plugged condition.

This object is achieved in accord with the invention for a backplane wiring of the type described above in that an additional opening is provided next to every opening for the passage of a contact blade, this additional opening being separated from the opening for the passage of the contact blade by a web, and in that the contact blade includes a calotte-like pock on one side which presses against the web after the centering strip has been plugged.

In the backplane wiring of the invention, the holding of the contact blade in the centering strip ensues and is ensured by means of the resilient web in the floor of the centering strip as well as by means of the calotte-like pock on the contact blade. Definable holding forces are thus present. As a consequence of the resiliency of the resilient web, the centering strip can be plugged to pre-equipped backplane printed circuit boards without exerting a great force. In that the web resiliently yields, contact blades can be replaced without sacrificing the holding function.

An expedient development of the backplane wiring of the invention is characterized in that all or some of the additional openings in the floor of the centering strips are constricted by shoulders. An incorrect placement of the centering strip on the contact blades of the backplane printed circuit board is thereby prevented when mounting the centering strip.

BRIEF DESCRIPTION OF THE DRAWINGS

The invention shall be explained in greater detail below with reference to an exemplary embodiment shown in the drawing. Shown therein are.

DESCRIPTION OF THE PREFERRED EMBODIMENTS

Figure 1:
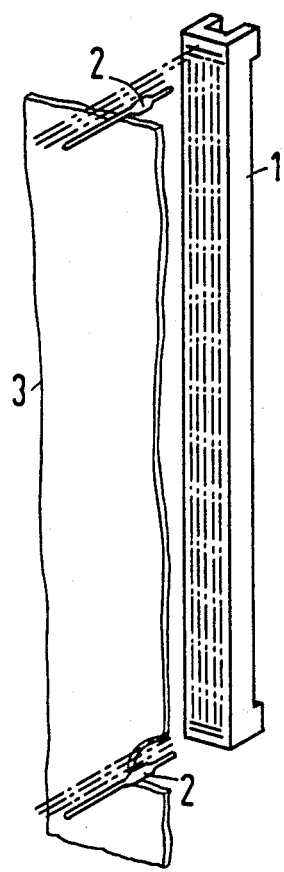
FIG. 1 is a part of a backplane printed circuit board comprising contact blades, and a centering strip.

For purposes of a better understanding, FIG. 1 shows the basic structure of a backplane wiring wherein a centering strip 1 is plugged onto a backplane printed circuit board 3 provided with contact blades 2.

Figure 2:
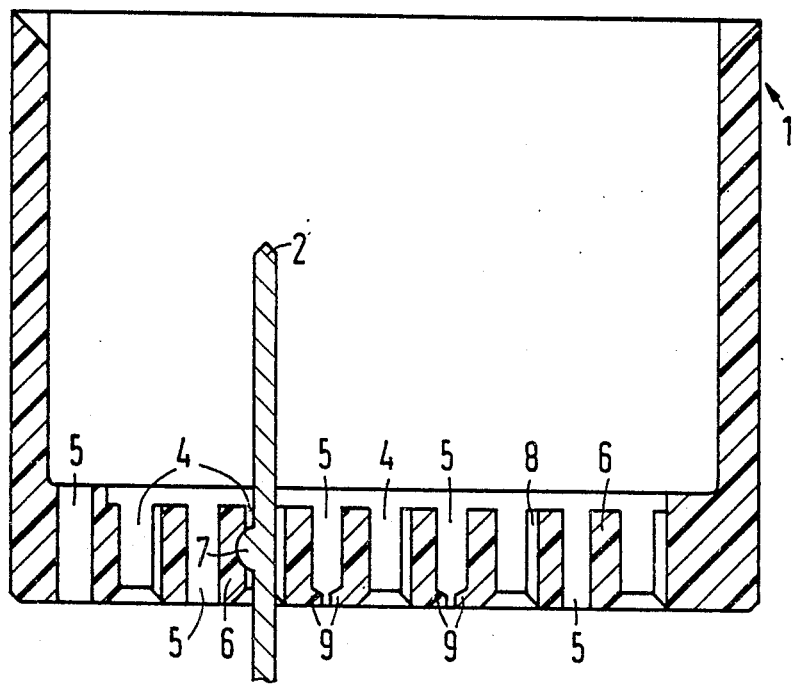
FIG. 2 is a cross section through a centering strip of the invention with an inserted contact blade.
Figure 3:
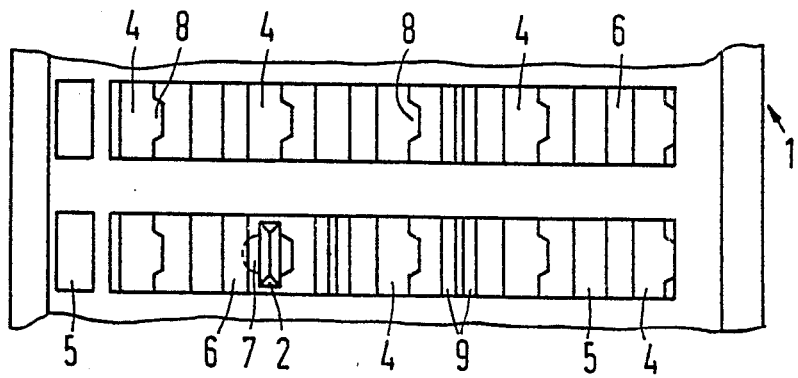
FIG. 3 is a partial plan view of a centering strip in accord with the present invention.

FIG. 2 shows a cross section through a centering strip of the present invention which is equipped with contact blades 2 of the invention. Only one contact blade 2 including a calotte-like pock 7 has been shown in the illustration. When the centering strip 1 is put in place on the backplane printed circuit board 3, the contact blades 2 penetrate through the passages 4, as is shown in FIG. 3. An additional opening 5 is provided in the centering strip 1 next to every passage 4, and a resilient web 6 separates every passage 4 from the adjacent opening 5. In the plugged condition of the centering strip 1, the pock 7 of the contact blade 2 presses against the web 6. As a result, there are clearly definable retaining forces for the contact blades in the centering strips 1.

As is shown in FIG. 3, the contact blades 2 have lateral play in the passages 4 (spaces above and below the blade 2 in FIG. 3) in order to create a tolerance compensation in longitudinal direction. As a result of the fact that the resilient web 6 yields when the centering strip 1 is plugged onto the contact blades 2, the centering strip 1 can be easily plugged onto the contact blades 2 given the backplane wiring of the invention.

In order to avoid incorrect plugging, i.e. in order to prevent the contact blades 2 from mistakenly penetrating into the additional openings 5, all or some of the additional openings 5 can be provided with shoulders 9 at their lower ends. The spring properties of the web 6 are not affected by these shoulders 9.

The passages 4 for the contact blades 2 also include additional recesses 8. These are provided for the case wherein contact blades having elastic insertion zones are employed.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. A backplane wiring for electrical assemblies having a backplane printed circuit board with inserted contact blades and centering strips pluggable thereonto which are constructed as a rectangular housing open at one side opposite a floor, said centering strips having openings in the floor for the passage of said contact blades, comprising an additional opening provided next to every contact blade opening, said additional opening being large enough to receive said contact blade and being separated from said contact blade opening by a resilient web, and said contact blade including a calotte-like pock on one side which presses against said resilient web after said centering strip has been pressed onto said contact blades to provide an elastic connection between said contact blade and said centering strip and permitting said centering strip to be pressed onto said contact blades without exertion of a great force, at least some of said additional openings in the floor of said centering strips having shoulders formed on said webs at an end thereof away from said open side to form a constricted opening small enough to prevent passage of said contact blades while permitting the webs to remain resilient, whereby said end of said web with said shoulder will be temporarily deflected upon passage of said pock past said end.

2. A backplane wiring according to claim 1, wherein said openings for the passage of said contact blades include a longitudinal recess at one longitudinal side.

3. In a backplane wiring for electrical assemblies having a backplane printed circuit board with inserted contact blades and centering strips pluggable thereonto by means of through openings in the centering strip which receive the contact blades at a receiving side, the improvement of:
   an additional through opening large enough to receive said contact blade provided next to each contact blade opening in said centering strip;
   said additional opening being separated from said contact blade opening by a resilient web;
   at least some of said additional openings having shoulders formed on said webs at said receiving side of said centering strip to form a constricted opening small enough to prevent passage of said contact blades while permitting said webs to remain resilient; and
   said contact blade including a rounded projection on at least one side which presses against said web after said centering strip has been plugged;
whereby said web and shoulder are temporarily deflected upon passage of said projection past said shoulder and an elastic connection between said contact blade and said centering strip results and said centering strips are pluggable onto said circuit board without exertion of a great force.

4. The combination comprising:
   a centering strip for use in a electrical assembly; and
   a plurality of contact blades;
      said centering strip having a first set of openings for receiving said contact blades from a receiving side;
      said centering strip having a second set of openings comprising an opening next to each opening of said first set;
      said openings of said second set being large enough to receive said contact blades and being separated from said openings of said first set by resilient webs;
   at least some of said openings of said second set having shoulders formed on said webs at said receiving side to form a constricted opening small enough to prevent passage of said contact blades while permitting said webs to remain resilient; and
      each of said contact blades having a rounded projection on one side thereof to press against said webs upon entry of said contact blades into said openings of said first set;
whereby said web and shoulder are temporarily deflected upon passage of said projection past said shoulder so that an elastic connection between said contact blades and said centering strip results and said centering strips are pluggable onto said circuit board without exertion of a great force.

* * * * *